United States Patent
Kawasaki

(10) Patent No.: US 9,671,455 B2
(45) Date of Patent: Jun. 6, 2017

(54) PRODUCT TESTING SYSTEM FOR A SEMICONDUCTOR DEVICE

(71) Applicant: FUJITSU LIMITED, Kawaskai-shi, Kanagawa (JP)

(72) Inventor: Kenichi Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 297 days.

(21) Appl. No.: 14/322,712

(22) Filed: Jul. 2, 2014

(65) Prior Publication Data
US 2015/0028909 A1 Jan. 29, 2015

(30) Foreign Application Priority Data

Jul. 29, 2013 (JP) .................. 2013-156791

(51) Int. Cl.
| | | |
|---|---|---|
| G01R 31/00 | (2006.01) | |
| G01R 31/28 | (2006.01) | |
| G01R 1/18 | (2006.01) | |
| G01R 1/067 | (2006.01) | |
| G01R 31/317 | (2006.01) | |
| G01R 31/327 | (2006.01) | |

(52) U.S. Cl.
CPC ..... *G01R 31/2856* (2013.01); *G01R 1/06705* (2013.01); *G01R 1/18* (2013.01); *G01R 31/31721* (2013.01); *G01R 31/001* (2013.01); *G01R 31/2801* (2013.01); *G01R 31/3277* (2013.01)

(58) Field of Classification Search
CPC .... G01R 1/06705; G01R 1/18; G01R 31/001; G01R 31/2801; G01R 1/0408; G01R 31/2601; G01R 31/2891; G01R 31/002; G01R 31/00; G01N 27/42; G01N 31/02
USPC ........ 324/762.01–762.05, 71, 378, 403, 415, 324/425, 500, 537, 750.26; 327/524–544
See application file for complete search history.

(56) References Cited

U.S. PATENT DOCUMENTS

| | | |
|---|---|---|
| 6,693,448 B1 | 2/2004 | Okada et al. |
| 2002/0011866 A1* | 1/2002 | Mizoguchi ..... G01R 31/318575 324/750.3 |
| 2003/0009713 A1* | 1/2003 | Endou ................... G11C 29/46 714/724 |

(Continued)

FOREIGN PATENT DOCUMENTS

| | | |
|---|---|---|
| JP | 2009-047557 A | 3/2009 |
| JP | 2009-246132 A | 10/2009 |

(Continued)

OTHER PUBLICATIONS

Japanese Office Action of related Japanese Patent Application No. 2013-156791 dated Feb. 7, 2017.

*Primary Examiner* — Huy Q Phan
*Assistant Examiner* — Raul Rios Russo
(74) *Attorney, Agent, or Firm* — Arent Fox LLP

(57) ABSTRACT

A semiconductor device includes: a first circuit; a first power switch provided either between a power supply potential terminal and a power supply potential node of the first circuit or between a reference potential terminal and a reference potential node of the first circuit; a power switch control circuit configured to control a voltage of a control terminal of the first power switch; a test terminal; and a first test control circuit configured to control connection of the test terminal and the control terminal of the first power switch.

19 Claims, 5 Drawing Sheets

(56) References Cited

U.S. PATENT DOCUMENTS

| | | | | |
|---|---|---|---|---|
| 2003/0112676 A1* | 6/2003 | Ooishi | .................. | G11C 5/147 |
| | | | | 365/201 |
| 2006/0113979 A1* | 6/2006 | Ishigaki | .............. | H02M 3/1588 |
| | | | | 323/282 |
| 2007/0234167 A1* | 10/2007 | Momii | ............. | G01R 31/31724 |
| | | | | 714/742 |
| 2008/0136466 A1* | 6/2008 | Nakagawa | ............. | H03K 5/151 |
| | | | | 327/109 |
| 2009/0045833 A1* | 2/2009 | Kawasaki | ........ | G01R 31/31721 |
| | | | | 324/764.01 |
| 2009/0051406 A1* | 2/2009 | Kawasaki | ........ | G01R 31/31721 |
| | | | | 327/419 |
| 2010/0123515 A1* | 5/2010 | Sasaki | .................. | G06F 1/3203 |
| | | | | 327/540 |
| 2012/0081151 A1* | 4/2012 | Tomita | ................ | H03H 11/265 |
| | | | | 326/121 |

FOREIGN PATENT DOCUMENTS

| | | |
|---|---|---|
| JP | 2012-194183 A | 10/2012 |
| WO | WO 00/11486 A1 | 3/2000 |

* cited by examiner

| PD | VDD1 | VDD2 | VSS | DEFECT DETECTION |
|---|---|---|---|---|
| 0.1 | 0 | 0 | 0 | PD |
| -1.0 | 0.1 | 0 | 0 | P1,P2,P3 |
| -1.0 | 0 | 0.1 | 0 | P1,P2 |

VOLTAGE [V]

| | VOLTAGE [V] | | | |
|---|---|---|---|---|
| PD | VDD | VSS | A1~An | POWER SWITCH |
| -1.0 | 0.1 | 0 | -0.5 | ON |

| | VOLTAGE [V] | | | |
|---|---|---|---|---|
| PD | VDD | VSS | A1~An | POWER SWITCH |
| OPEN (=VDD) | 1.2 | 0 | 0 | ON |
| | | | 1.2 | OFF |

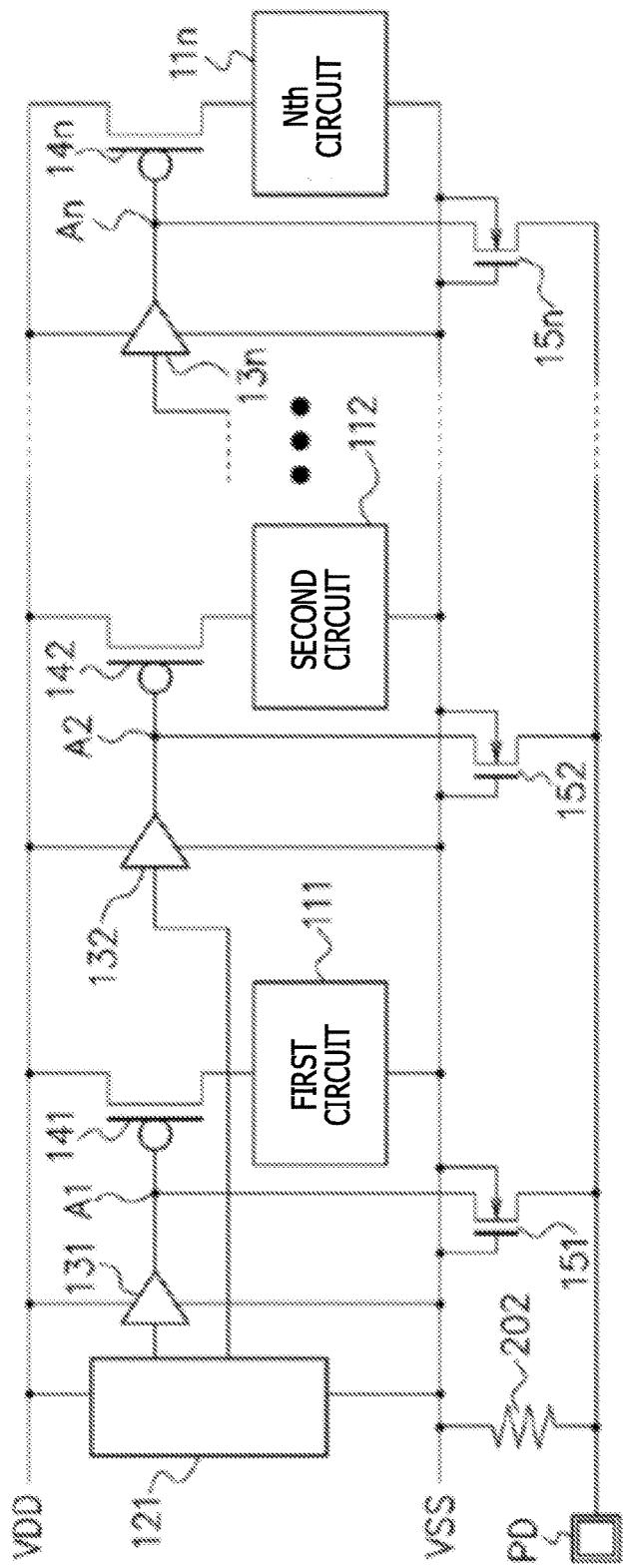

| VOLTAGE [V] | | | | |
|---|---|---|---|---|
| PD | VDD | VSS | A1~An | POWER SWITCH |
| 1.2 | 0.1 | 0 | 0.7 | ON |

| VOLTAGE [V] | | | | |
|---|---|---|---|---|
| PD | VDD | VSS | A1~An | POWER SWITCH |
| OPEN (=VSS) | 1.2 | 0 | 1.2 | ON |
| | | | 0 | OFF |

PRODUCT TESTING SYSTEM FOR A SEMICONDUCTOR DEVICE

CROSS-REFERENCE TO RELATED APPLICATION

This application is based upon and claims the benefit of priority from the prior Japanese Patent Application No. 2013-156791 filed on Jul. 29, 2013, the entire contents of which are incorporated herein by reference.

FIELD

Exemplary embodiments of the present disclosure are related to a semiconductor device.

BACKGROUND

A semiconductor device which controls the supply of power to an internal circuit is known (see, for example, Japanese Laid-open Patent Publication No. 2009-246132). The logic circuit operates using power supplied from a first power line and a second power line. A switch turns ON and OFF of the supply of power from the first power line to the logic circuit. The semiconductor device includes a disconnectable power supplying device which is connected with the switch in parallel to supply power of the first power line to the logic circuit.

Further, a semiconductor device is known including a circuit block, a first switch provided between a first power line and a second power line which supplies a power supply voltage to the circuit block, and a second switch provided between the first power line and the second power line (see, for example, Japanese Laid-open Patent Publication No. 2012-194183). The first switch is turned ON in a test mode. The second switch is turned OFF in the test mode, and the operating state of the circuit block is turned ON/OFF in a normal operating mode according to turning ON/OFF of the second switch.

A related technique is disclosed in Japanese Laid-open Patent Publication No. 2009-246132 and Japanese Laid-open Patent Publication No. 2012-194183.

The disconnectable power supplying device is needed and thus, there is a problem of increase of area overhead to be solved in Japanese Laid-open Patent Publication No. 2009-246132. Further, a process of disconnecting the power supplying device is inevitably added after testing and thus, there is a problem of increase of cost to be solved. Further, there is a problem to be solved that a leak current increases due to the quality of disconnection of the power supplying device, causing increase of defective products.

Further, a first switch is needed in addition to a second switch and thus, there is a problem of increase of area overhead to be solved in Japanese Laid-open Patent Publication No. 2012-194183.

An object according to one aspect of the present disclosure is to provide a semiconductor device which may be tested while suppressing area overhead.

SUMMARY

According to an aspect of the invention, a semiconductor device includes: a first circuit; a first power switch provided either between a power supply potential terminal and a power supply potential node of the first circuit or between a reference potential terminal and a reference potential node of the first circuit; a power switch control circuit configured to control a voltage of a control terminal of the first power switch; a test terminal; and a first test control circuit configured to control connection of the test terminal and the control terminal of the first power switch.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 3A, 3B and 3C are views illustrating a semiconductor device according to a third embodiment.

DESCRIPTION OF EMBODIMENTS

First Embodiment

Figures 1A, 1B:
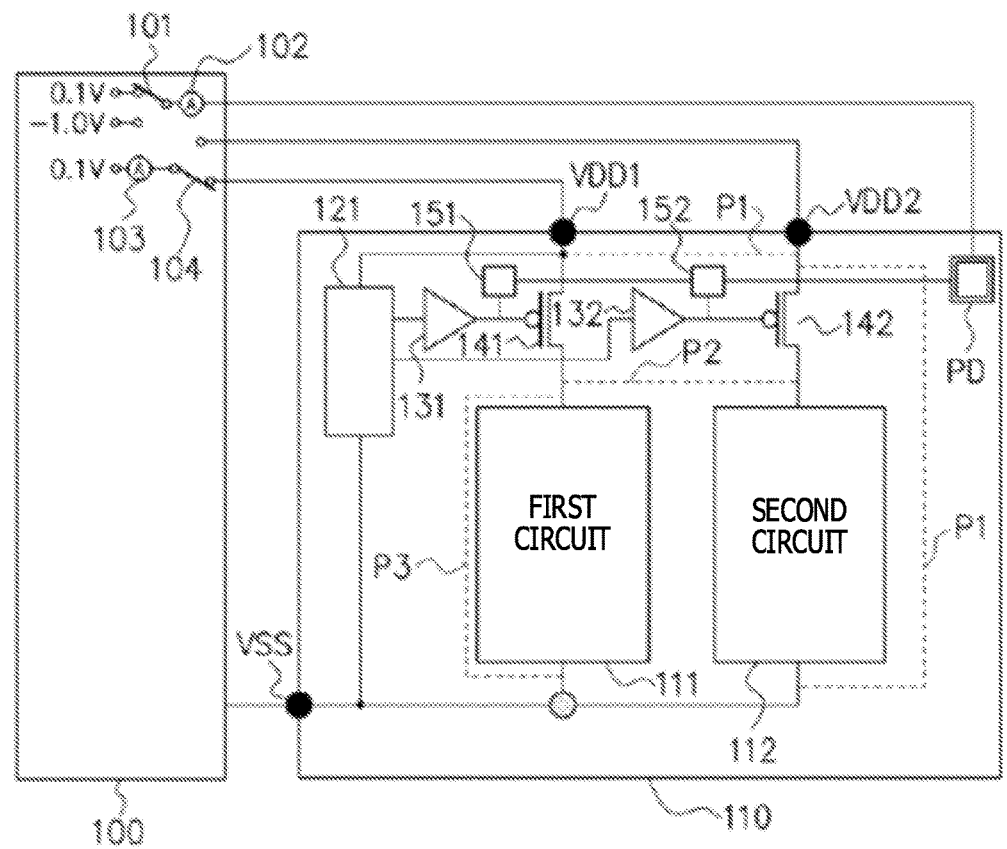
FIGS. 1A and 1B are views illustrating a test system according to a first embodiment.

FIG. 1A illustrates an exemplary configuration of a test system according to a first embodiment. The test system includes a test device (tester) 100 and a semiconductor device (semiconductor chip) 110. The test device 100 includes switches 101 and 104 and current detection units 102 and 103. The semiconductor device 110 includes a first circuit 111, a second circuit 112, a power switch control circuit 121, a first buffer 131, a second buffer 132, a first power switch 141, a second power switch 142, a first test control circuit 151, a second test control circuit 152, a test terminal (test pad) PD, a reference potential node VSS, a first power supply potential node VDD1 and a second power supply potential node VDD2.

The first circuit 111 includes a power supply potential terminal and a reference potential terminal. The power supply potential terminal of the first circuit 111 is connected to the first power supply potential node VDD1 through the first power switch 141. The reference potential terminal of the first circuit 111 is connected to the reference potential node VSS. The first power switch 141 is a p-channel FET (field effect transistor) having a source connected to the first power supply potential node VDD1 and a drain connected to the power supply potential terminal of the first circuit 111.

The second circuit 112 includes a power supply potential terminal and a reference potential terminal. The power supply potential terminal of the second circuit 112 is connected to the second power supply potential node VDD2 through the second power switch 142. The reference potential terminal of the second circuit 112 is connected to the reference potential node VSS. The second power switch 142 is a p-channel FET having a source connected to the second power supply potential node VDD2 and a drain connected to the power supply potential terminal of the second circuit 112.

The power switch control circuit 121 supplies the first control voltage to a gate of the first power switch 141 through the first buffer 131 and the second control voltage to a gate of the second power switch 142 through the second buffer 132. In a normal operation mode, the power supply potential of, for example, 1.2V, is supplied to the first power supply potential node VDD1, and the second power supply potential node VDD2 from outside and the reference potential of, for example, 0V, is supplied to the reference potential node VSS from outside.

The power switch control circuit 121 keeps the gate voltage of the first power switch 141 at a low level in a period during which the first circuit 111 is used. By doing this, the first power switch 141 turns ON and connects the first power supply potential node VDD1 with the power supply potential terminal of the first circuit 111. Accordingly, the first circuit 111 is operated by receiving a supply of the power supply voltage.

In contrast, the power switch control circuit 121 keeps the gate voltage of the first power switch 141 at a high level in a period during which the first circuit 111 is not used. By doing this, the first power switch 141 turns OFF and disconnects the first power supply potential node VDD1 from the power supply potential terminal of the first circuit 111. The first circuit 111 does not receive the supply of the power supply voltage and does not operate. The first power switch 141 may be turned OFF to reduce, for example, leak currents, to reduce power consumption.

Similarly, the power switch control circuit 121 keeps the gate voltage of the second power switch 142 at a low level in a period during which the second circuit 112 is used. By doing this, the second power switch 142 turns ON and connects the second power supply potential node VDD2 with the power supply potential terminal of the second circuit 112. Accordingly, the second circuit 112 is operated by receiving a supply of the power supply voltage.

In contrast, the power switch control circuit 121 keeps the gate voltage of the second power switch 142 at a high level in a period during which the second circuit 112 is not used. By doing this, the second power switch 142 turns OFF and disconnects the second power supply potential node VDD2 from the power supply potential terminal of the second circuit 112. The second circuit 112 does not receive the supply of the power supply voltage and does not operate. The second power switch 142 may be turned OFF to reduce, for example, leak currents, to reduce power consumption.

The test device 100 may perform a defective product detection test for the semiconductor device 110 to determine whether the power supply is short-circuited as a shipment test after manufacturing the semiconductor device 110. When the first power switch 141 and the second power switch 142 exist, a test regarding whether any one of short-circuit paths P1, P2, P3 exists is performed. When any one of the short-circuit paths P1, P2, P3 exists, the power supply potential nodes VDD1 and VDD2 and the reference potential node VSS are short-circuited and a large current flows and thus, the semiconductor device 110 is determined as a defective product.

The semiconductor device 110 includes a single test terminal PD common to a plurality of power switches 141 and 142 and a plurality of test control circuits 151 and 152 that correspond to the plurality of power switches 141 and 142 in order to enable implementation of the test. The first test control circuit 151 controls connection between the test terminal PD and the gate of the first power switch 141. The second test control circuit 152 controls connection between the test terminal PD and the gate of the second power switch 142.

FIG. 1B is a diagram illustrating a voltage applied to the semiconductor device 110 by the test device 100. First, as illustrated in a first row of FIG. 1B, in a test mode, the test device 100 supplies a voltage of 0.1V to the test terminal PD through the first switch 101, 0V to the first power supply potential node VDD1, 0V to the second power supply potential node VDD2 and 0V to the reference potential node VSS. The current detection unit 102 detects a current flowing to the test terminal PD. When the current flowing to the test terminal PD is larger than a threshold value, the test device 100 may regard that the test terminal PD is short-circuited to the first power supply potential node VDD1, the second power supply potential node VDD2 or the reference potential node VSS to detect a defective product which has a defective test terminal PD.

Further, in the normal operation mode, the power supply potential of 1.2V is supplied to the power supply potential nodes VDD1 and VDD2. In the test mode of the first row of FIG. 1B, when 1.2V is supplied to the test terminal PD, there may be a risk that a large current flows to the test terminal PD to destroy the test device 100 and the semiconductor device 110 in a case where the test terminal PD is in a short-circuited state. Therefore, a low voltage of 0.1V may be supplied to the test terminal PD to prevent the test device 100 and the semiconductor device 110 from being destroyed.

When the test terminal PD is not a defective product, as illustrated in a second row of FIG. 1B, in the test mode, the test device 100 supplies a voltage of −1.0V to the test terminal PD through the switch 101, a voltage of 0.1V to the first power supply potential node VDD1 through the switch 104, 0V to the second power supply potential node VDD2 and 0V to the reference potential node VSS. Since the voltage of the test terminal PD is −1.0V, the first test control circuit 151 turns ON and thus, the gate potential of the first power switch 141 goes to the negative potential and the first power switch 141 turns ON. The current detection unit 103 detects a current flowing to the first power supply potential node VDD1. When the current flowing to the first power supply potential node VDD1 is larger than the threshold value, the test device 100 may regard that the short-circuit path P1, P2 or P3 exists to detect a defective product which has a short-circuit path P1, P2 or P3. Further, as described above, the test device 100 may supply a low voltage of 0.1V to the first power supply potential node VDD1 to prevent the test device 100 and the semiconductor device 110 from being destroyed.

Next, as illustrated in a third row of FIG. 1B, in the test mode, the test device 100 supplies a voltage of −1.0V to the test terminal PD through the switch 101, 0V to the first power supply potential node VDD1, 0.1V to the second power supply potential node VDD2 through the switch 104 and 0V to the reference potential node VSS. Since the voltage of the test terminal PD is −1.0V, the second test control circuit 152 turns ON and thus the gate potential of the second power switch 142 goes to the negative potential and the second power switch 142 turns ON. The current detection unit 103 detects a current flowing to the second power supply potential node VDD2. When the current flowing to the second power supply potential node VDD2 is larger than the threshold value, the test device 100 may regard that the short-circuit path P1 or P2 exists to detect a defective product which has the short-circuit path P1 or P2. Further, as described above, the test device 100 may supply a low voltage of 0.1V to the second power supply potential node VDD2 to prevent the test device 100 and the semiconductor device 110 from being destroyed.

As described above, the power switches 141 and 142 may be forcibly turned ON to detect all of the short-circuit paths P1, P2 and P3.

After the test mode described above, mode is changed to a normal operation mode. In the normal operation mode, the power supply potential of 1.2V is supplied to the power supply potential nodes VDD1 and VDD2 and the reference potential of 0V is supplied to the reference potential node VSS. The test control circuits 151 and 152 are turned OFF and the gates of the power switches 141 and 142 are disconnected from the test terminal PD. Turning ON/OFF of the first power switch 141 and the second power switch 142 are controlled by the power switch control circuit 121.

According to the present embodiment, only a single test terminal PD is required for the semiconductor system regardless of the number of circuits 111 and 112 controlled by the power switches 141 and 142 and thus, it is possible to reduce the area overhead. Further, in addition to the power switches 141 and 142, only the test control circuits 151 and 152 need to be added without a need to add the power switch for the test and thus, the area overhead may be reduced. Further, since only a single test terminal PD exists, a test time may be shortened as compared to a case where a plurality test terminals are installed by being corresponded to the plurality of power switches 141 and 142.

Second Embodiment

Figures 2A, 2B, 2C:
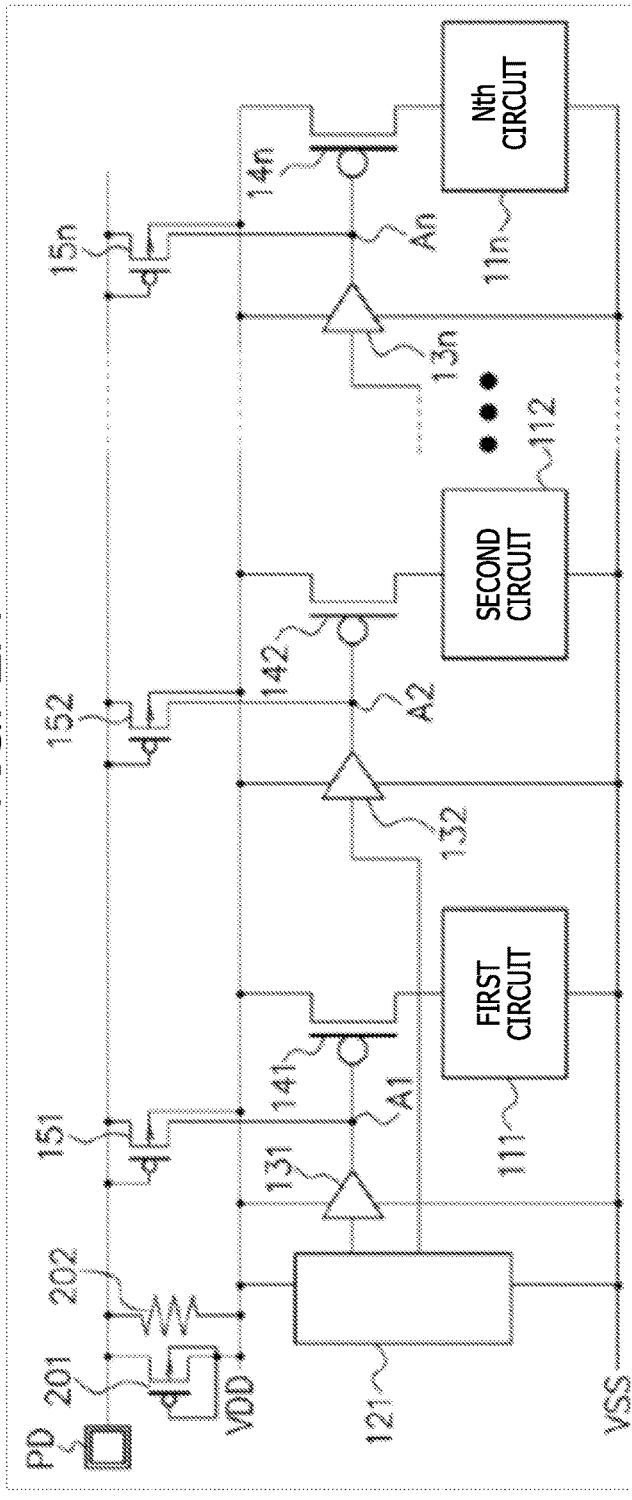
FIGS. 2A, 2B and 2C are views illustrating a semiconductor device according to a second embodiment.

FIG. 2A is a view illustrating an example of a configuration of the semiconductor device according to a second embodiment. The semiconductor device corresponds to the semiconductor device 110 of FIG. 1A. Hereinafter, the description will be made on a difference between the present embodiment and the first embodiment. The present embodiment is provided with n circuits 111 to 11n instead of two circuits 111 and 112, n buffers 131 to 13n instead of two buffers 131 and 13n and n power switches 141 to 14n instead of two power switches 141 and 142, compared to the first embodiment. The sources of the power switch 141 to 14n are connected to the power supply potential node VDD.

The nth circuit 11n includes a power supply potential terminal and a reference potential terminal. The power supply potential terminal of the nth circuit 1 in is connected to the power supply potential node VDD through the nth power switch 14n. The reference potential terminal of the nth circuit 11n is connected to the reference potential node VSS. The nth power switch 14n is a p-channel FET having a source connected to the power supply potential node VDD and a drain connected to the power supply potential terminal of the nth circuit 11n. The power switch control circuit 121 supplies an nth control voltage to the gate of the nth power switch 14n through the nth buffer 13n.

The first test control circuit 151 is a diode-connected p-channel FET having a gate and drain connected to the test terminal PD, a back gate (substrate bias node) connected to the power supply potential node VDD and a source connected to the gate A1 of the first power switch 141.

The second test control circuit 152 is a diode-connected p-channel FET having a gate and a drain connected to the test terminal PD, the back gate connected to the power supply potential node VDD and a source connected to the gate A2 of the second power switch 142.

The nth test control circuit 15n is a diode-connected p-channel FET having a gate and a drain connected to the test terminal PD, the back gate connected to the power supply potential node VDD and a source connected to the gate An of the nth power switch 14n.

An ESD (Electrostatic Discharge) protection element 201 is a diode-connected p-channel FET having a source connected to the test terminal PD and a gate, a drain and a back gate that are connected to the power supply potential node VDD.

A resistor 202 is a pull-up resistor having a high resistance value and is connected between the test terminal PD and the power supply potential node VDD.

As described above, when the power switch 141 to 14n are the p-channel FET, the test control circuits 151 to 15n use the diode-connected p-channel FET which regards the current flowing from the gates A1 to An of the power switches 141 to 14n to the test terminal PD as a current flowing in a forward direction. The pull-up resistor 202 is a resistor for clamping the potential of the test terminal PD to the potential of the power supply potential node VDD in the normal operation mode. The ESD protection element 201 is a protection element for protecting the gate oxide films of the test control circuits (p-channel FETs) 151 to 15n from electrostatic breakdown and serves to forcibly let electrostatic breakdown charges introduced into the test terminal PD escape to the power supply potential node VDD. The ESD protection element 201 is the diode-connected p-channel FET which regards the current flowing from the gates A1 to An of the power switches 141 to 14n to the test terminal PD as a current flowing in a forward direction.

FIG. 2B is a diagram illustrating a voltage applied to the semiconductor device of FIG. 2A in the test mode. First, similarly to the first row of FIG. 1B, in the test mode, the test device 100 of FIG. 1A supplies a voltage of 0.1V to the test terminal PD, 0V to the power supply potential node VDD, and 0V to the reference potential node VSS to perform a short-circuiting test of the test terminal PD.

Next, as illustrated in FIG. 2B, in the test mode, the test device 100 supplies a voltage of −1.0V to the test terminal PD, a voltage of 0.1V to the power supply potential node VDD and 0V to the reference potential node VSS. In the test mode, a negative potential of −1.0V is forcibly applied to the test terminal PD against the pull-up resistor 202 in order not for the ESD protection element 201 to inhibit the test. When the threshold voltage of test control circuits (p-channel FETs) 151 to 15n is 0.6V, the gates A1 to An of the power switches 141 to 14n become a negative potential of about −0.5V. By doing this, all the power switches 141 to 14n are turned ON and thus, a short-circuit test on a power source may be enabled. The current detection unit 103 detects the current flowing to the power supply potential node VDD. When the current flowing to the power supply potential node VDD is larger than the threshold value, the test device 100 may regard that the short-circuit path exists to detect a defective product which has a short-circuit path.

FIG. 2C is a diagram illustrating a voltage applied to the semiconductor device of FIG. 2A in the normal operation mode. In the normal operation mode, the test terminal PD is brought into an open state, the power supply potential of 1.2V is supplied to the power supply potential node VDD and the reference potential of 0V is supplied to the reference potential node VSS. By causing the test terminal PD to be in the open state, the potential of the test terminal PD becomes identical with that of the power supply potential node VDD through the pull-up resistor 202. Accordingly, the diode-connected p-channel FET of the test control circuits 151 to 15n becomes invalid and the gates A1 to An of the power switches 141 to 14n goes to a state where the gates A1 to An are disconnected from the test terminal PD. The voltage of the gates A1 to An of the power switches 141 to 14n is controlled by the power switch control circuit 121. When each voltage of the gates A1 to An is 0V, each of the power switches 141 to 14n is turned ON, respectively. In contrast, when each voltage of the gates A1 to An is 12V, each of the power switches 141 to 14n is turned OFF, respectively.

Third Embodiment

FIG. 3A is a view illustrating an example of a configuration of the semiconductor device according to a third embodiment. The semiconductor device corresponds to the semiconductor device 110 of FIG. 1A. Hereinafter, the description will be made on a difference between the present embodiment and the second embodiment.

The first test control circuit 151 is an n-channel FET having a drain connected to the gate A1 of the first power switch 141, a gate and a back gate connected to the reference potential node VSS and a source connected to the test terminal PD.

The second test control circuit 152 is the n-channel FET having a drain connected to the gate A2 of the second power switch 142, a gate and a back gate connected to the reference potential node VSS and a source connected to the test terminal PD.

The nth test control circuit 15n is the n-channel FET having a drain connected to the gate An of the nth power switch 14n, a gate and a back gate connected to the reference potential node VSS and a source connected to the test terminal PD.

The resistor 202 is a pull-down resistor having a high resistance value and is connected between the test terminal PD and the reference potential node VSS. The ESD protection element 201 of FIG. 2A is not needed and thus deleted in FIG. 3A.

In the present embodiment, unlike the second embodiment, the test control circuits 151 to 15n are a gate-grounded n-channel FET for establishing a through connection between the gates A1 to An of the power switch 141 to 14n and the test terminal PD. The pull-down resistor 202 is a resistor for clamping the potential of the test terminal PD to the potential of the reference potential node VSS in the normal operation mode. The present embodiment has an advantage over the second embodiment that the gates of the test control circuits (n-channel FETs) 151 to 15n are not directly connected to the test terminal PD and thus, the ESD protection element 201 of the FIG. 2A is not needed. However, the sources of the test control circuits (n-channel FETs) 151 to 15n are connected to the test terminal PD and the reference potential node VSS is connected to the back gates (substrate bias nodes) of the test control circuits (n-channel FETs) 151 to 15n. Therefore, the threshold voltage in a forward direction of the PN junction of the test control circuits (n-channel FETs) 151 to 15n is about 0.6V and thus, a test potential of −0.6 V or less may not be applied to the test terminal PD.

FIG. 3B is a diagram illustrating a voltage applied to the semiconductor device of FIG. 3A in the test mode. First, similarly to the first row of FIG. 1B, in the test mode, the test device 100 of FIG. 1A supplies a voltage of 0.1V to the test terminal PD, 0V to the power supply potential node VDD, and 0V to the reference potential node VSS to perform a short-circuiting test of the test terminal PD.

Next, as illustrated in FIG. 3B, in the test mode, the test device 100 supplies a voltage of −0.5V to the test terminal PD, a voltage of 0.1V to the power supply potential node VDD and 0V to the reference potential node VSS. In the test mode, a negative potential of −0.5V is forcibly applied to the test terminal PD against the pull-down resistor 202. Since the test control circuits 151 to 15n are in an ON state, the potential of the gates A1 to An of the power switches 141 to 14n become a negative voltage of −0.5V. By doing this, all the power switches 141 to 14n are turned ON and thus, a short-circuit test on a power source may be enabled. The current detection unit 103 detects the current flowing to the power supply potential node VDD. When the current flowing to the power supply potential node VDD is larger than the threshold value, the test device 100 may regard that the short-circuit path exists to detect a defective product which has a short-circuit path.

Here, the present embodiment has an advantage that a through connected re-channel FET is used in the test control circuit 151-15n and thus, the potential which is almost the same as the negative potential (−0.5V) applied to the test terminal PD may be propagated to the gates A1 to An.

FIG. 3C is a diagram illustrating a voltage applied to the semiconductor device of FIG. 3A in the normal operation mode. In the normal operation mode, the test terminal PD is brought into an open state, the power supply potential of 1.2V is supplied to the power supply potential node VDD and the reference potential of 0V is supplied to the reference potential node VSS. By causing the test terminal PD to be in the open state, the potential of the test terminal PD becomes 0V, which is identical with that of the reference potential node VSS, through the pull-down resistor 202. Accordingly, the n-channel FET of the test control circuits 151 to 15n becomes invalid and the gates A1 to An of the power switches 141 to 14n is brought into a state where the gates A1 to An are disconnected from the test terminal PD. The voltage of the gates A1 to An of the power switches 141 to 14n is controlled by the power switch control circuit 121. When each voltage of the gates A1 to An is 0V, each of the power switches 141 to 14n is turned ON, respectively. In contrast, when each voltage of the gates A1 to An is 1.2V, each of the power switches 141 to 14n is turned OFF, respectively.

Fourth Embodiment

Figures 4A, 4B, 4C:
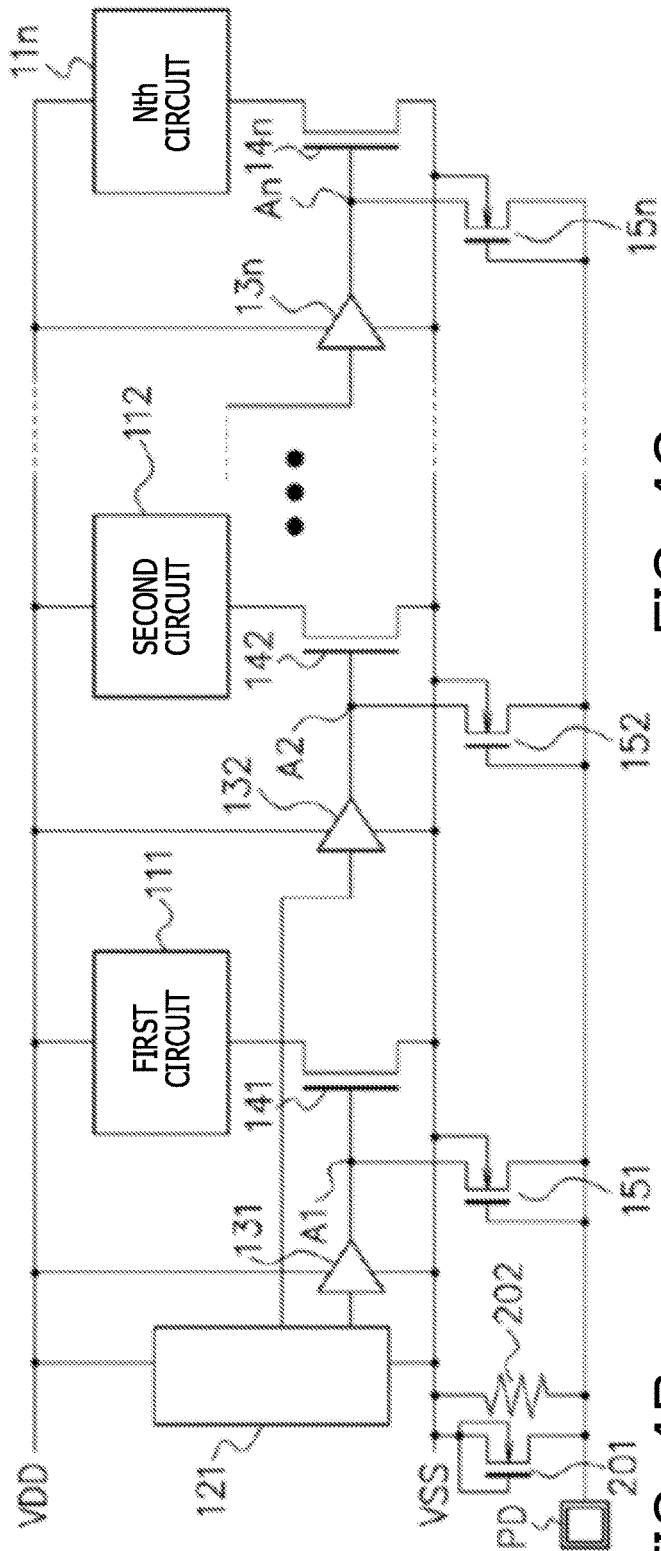
FIGS. 4A, 4B and 4C are views illustrating a semiconductor device according to a fourth embodiment.

FIG. 4A is a view illustrating an example of a configuration of the semiconductor device according to a fourth embodiment. The semiconductor device corresponds to the semiconductor device 110 of FIG. 1A. Hereinafter, the description will be made on a difference between the present embodiment and the second embodiment. The present embodiment (FIG. 4A) is different from the second embodiment (FIG. 2A) in that the power switches 141 to 14n are configured by the n-channel FET instead of the p-channel FET.

The first circuit 111 includes a power supply potential terminal and a reference potential terminal. The reference potential terminal of the first circuit 111 is connected to the reference potential node VSS through the first power switch 141. The power supply potential terminal of the first circuit 111 is connected to the power supply potential node VDD. The first power switch 141 is an n-channel FET having a source connected to the reference potential node VSS and a drain connected to the reference potential terminal of the first circuit 111.

The second circuit 112 includes a power supply potential terminal and a reference potential terminal. The reference potential terminal of the second circuit 112 is connected to the reference potential node VSS through the second power switch 142. The power supply potential terminal of the second circuit 112 is connected to the power supply potential node VDD. The second power switch 142 is the n-channel FET having a source connected to the reference potential node VSS and a drain connected to the reference potential terminal of the second circuit 112.

The nth circuit 11n includes a power supply potential terminal and a reference potential terminal. The reference potential terminal of the nth circuit 11n is connected to the reference potential node VSS through the nth power switch 14n. The power supply potential terminal of the nth circuit 11n is connected to the power supply potential node VDD. The nth power switch 14n is the n-channel FET having a source connected to the reference potential node VSS and a drain connected to the reference potential terminal of the nth circuit 11n.

The power switch control circuit 121 supplies a first control voltage to the gate A1 of the first power switch 141 through the first buffer 131, a second control voltage to the gate A2 of the second power switch 142 through the second buffer 132, and an nth control voltage to the gate An of the nth power switch 14n through the nth buffer 13n.

The first test control circuit 151 is a diode-connected n-channel FET having a source connected to the gate A1 of the first power switch 141, a back gate connected to the reference potential node VSS and a gate and a drain connected to the test terminal PD.

The second test control circuit 152 is the diode-connected n-channel FET having a source connected to the gate A2 of the second power switch 142, a back gate connected to the reference potential node VSS and a gate and a drain that are connected to the test terminal PD.

The nth test control circuit 152 is the diode-connected n-channel FET having a source connected to the gate An of the nth power switch 14n, a back gate connected to the reference potential node VSS, and a gate and a drain that are connected to the test terminal PD.

The ESD protection element 201 is a diode-connected n-channel FET having a source connected to the test terminal PD, and a gate, a drain and a back gate that are connected to the reference potential node VSS.

A resistor 202 is a pull-down resistor having a high resistance value and is connected between the test terminal PD and the reference potential node VSS.

In the present embodiment, the power switches 141 to 14n are configured by the n-channel FET. The test control circuits 151 to 15n use the diode-connected re-channel FET which regards the current flowing to the gates A1 to An of the power switches 141 to 14n from the test terminal PD as a current flowing in a forward direction. The pull-down resistor 202 is a resistor for clamping the potential of the test terminal PD to the potential of the reference potential node VSS. The ESD protection element 201 is a protection element for protecting the gate oxide films of the test control circuits (n-channel FETs) 151 to 15n from electrostatic breakdown and serves to forcibly let electrostatic breakdown charges introduced into the test terminal PD escape to the reference potential node VSS. The ESD protection element 201 is the diode-connected n-channel FET which regards the current flowing from the reference potential node VSS to the test terminal PD as a current flowing in a forward direction.

FIG. 4B is a diagram illustrating a voltage applied to the semiconductor device of FIG. 2A in the test mode. First, similarly to the first row of FIG. 1A, in the test mode, the test device 100 of FIG. 1A supplies a voltage of 0.1V to the test terminal PD, 0V to the power supply potential node VDD and 0V to the reference potential node VSS to perform a short-circuiting test of the test terminal PD.

Next, as illustrated in FIG. 4B, in the test mode, the test device 100 supplies a voltage of 1.2V to the test terminal PD, a voltage of 0.1V to the power supply potential node VDD and 0V to the reference potential node VSS. In the test mode, a high potential of 1.2V is forcibly applied to the test terminal PD against the pull-up resistor 202 in order not for the ESD protection element 201 to inhibit the test. When the threshold voltage of test control circuits (p-channel FETs) 151 to 15n is 0.5V, the gates A1 to An of the power switches 141 to 14n become a positive potential of about 0.7V. By doing this, all the power switches 141 to 14n are turned ON and thus, a short-circuit test on a power source a short-circuit test may be enabled. The current detection unit 103 detects the current flowing to the power supply potential node VDD. When the current flowing to the power supply potential node VDD is larger than the threshold value, the test device 100 may regard that the short-circuit path exists to detect a defective product which has a short-circuit path.

FIG. 4C is a diagram illustrating a voltage applied to the semiconductor device of FIG. 4A in the normal operation mode. In the normal operation mode, the test terminal PD is brought into an open state, the power supply potential of 1.2V is supplied to the power supply potential node VDD and the reference potential of 0V is supplied to the reference potential node VSS. By causing the test terminal PD to be in the open state, the potential of the test terminal PD becomes identical with that of the reference potential node VSS through the pull-down resistor 202. Accordingly, the diode-connected n-channel FET of the test control circuits 151 to 15n becomes invalid and the gates A1 to An of the power switches 141 to 14n become a state where the gates A1 to An are disconnected from the test terminal PD. The voltage of the gates A1 to An of the power switches 141 to 14n is controlled by the power switch control circuit 121. When each voltage of the gates A1 to An is 1.2V, each of the power switches 141 to 14n is turned ON, respectively. In contrast, when each voltage of the gates A1 to An is 0V, each of the power switches 141 to 14n is turned OFF, respectively.

Fifth Embodiment

Figures 5A, 5B, 5C:
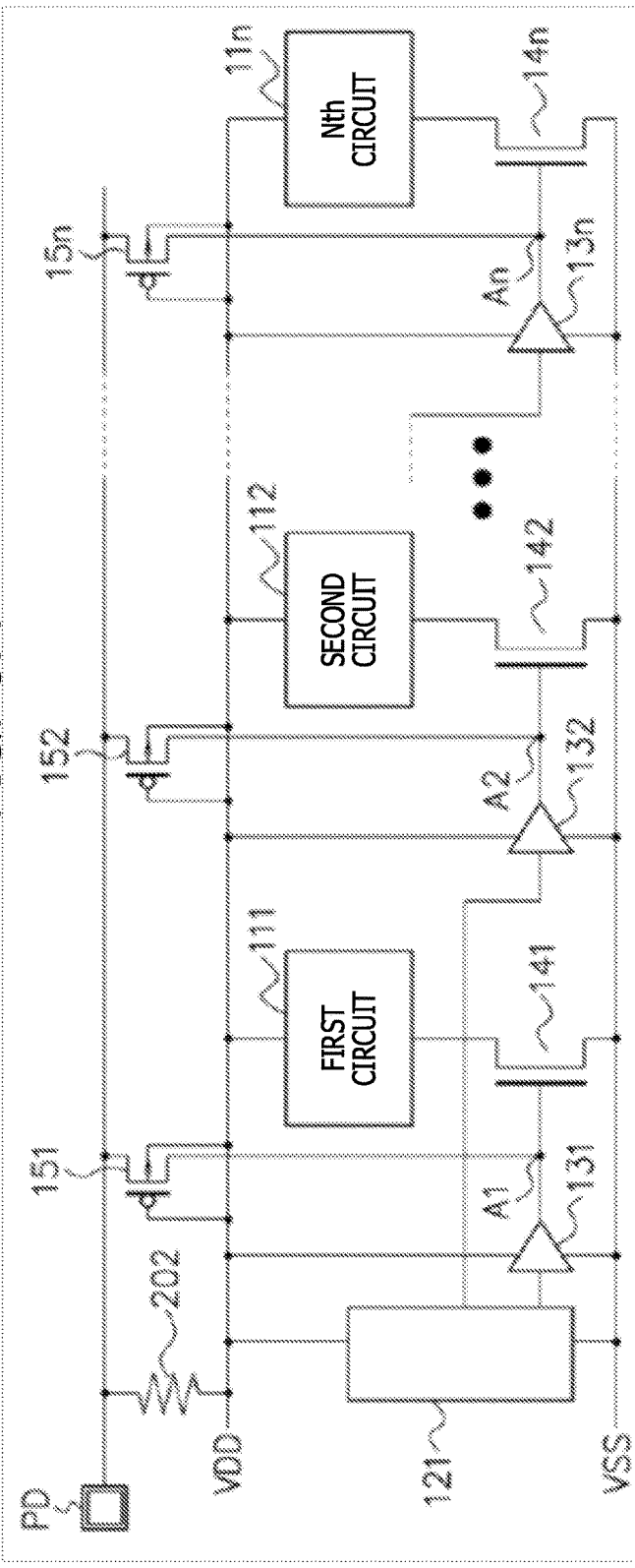
FIGS. 5A, 5B and 5C are views illustrating a semiconductor device according to a fifth embodiment.

FIG. 5A is a view illustrating an example of a configuration of the semiconductor device according to a fifth embodiment. The semiconductor device corresponds to the semiconductor device 110 of FIG. 1A. Hereinafter, the description will be made on a difference between the present embodiment and the fourth embodiment. The present embodiment (FIG. 5A) is different from the second embodiment (FIG. 2A) in that the test control circuit 151 to 15n are configured by the p-channel FET instead of the n-channel FET.

The first test control circuit 151 is a p-channel FET having a drain connected to the gate A1 of the first power switch 141, a gate and a back gate connected to the power supply potential node VDD and a source connected to the test terminal PD.

The second test control circuit 152 is the p-channel FET having a drain connected to the gate A2 of the second power switch 142, a gate and a back gate that are connected to the power supply potential node VDD, and a source connected to the test terminal PD.

The nth test control circuit 15n is the p-channel FET having a drain connected to the gate An of the nth power switch 14n, a gate and a back gate that are connected to the power supply potential node VDD, and a source connected to the test terminal PD.

The resistor 202 is a pull-up resistor having a high resistance value and is connected between the test terminal PD and the power supply potential node VDD. The ESD protection element 201 of FIG. 4A is not needed and thus deleted in FIG. 4A.

In the present embodiment, the test control circuits 151 to 15n are the p-channel FETs for establishing a through connection between the gates A1 and An of the power switch 141 to 14n and the test terminal PD. The pull-up resistor 202 is a resistor for clamping the potential of the test terminal PD to the potential of the power supply potential node VDD. The present embodiment has an advantage over the fourth embodiment that the gates of the test control circuits (p-channel FETs) 151 to 15n are not directly connected to the test terminal PD and thus, the ESD protection element 201 of the FIG. 4A is not needed.

FIG. 5B is a diagram illustrating a voltage applied to the semiconductor device of FIG. 5A in the test mode. First, similarly to the first row of FIG. 1B, in the test mode, the test device 100 of FIG. 1A supplies a voltage of 0.1V to the test terminal PD, 0V to the power supply potential node VDD, and 0V to the reference potential node VSS to perform a short-circuiting test of the test terminal PD.

Next, as illustrated in FIG. 5B, in the test mode, the test device 100 supplies a voltage of 0.7V to the test terminal PD, a voltage of 0.1V to the power supply potential node VDD and 0V to the reference potential node VSS. In the test mode, a positive potential of 0.7V is forcibly applied to the test terminal PD against the pull-down resistor 202. Since the test control circuits 151 to 15n are in an ON state, the potential of the gates A1 to An of the power switches 141 to 14n become a positive voltage of 0.7V. By doing this, all the power switches 141 to 14n are turned ON and thus, a short-circuit test on a power source may be enabled. The current detection unit 103 detects the current flowing to the power supply potential node VDD. When the current flowing to the power supply potential node VDD is larger than the threshold value, the test device 100 may regard that the short-circuit path exists to detect a defective product which has a short-circuit path.

FIG. 5C is a diagram illustrating a voltage applied to the semiconductor device of FIG. 5A in the normal operation mode. In the normal operation mode, the test terminal PD is brought into an open state, the power supply potential of 1.2V is supplied to the power supply potential node VDD and the reference potential of 0V is supplied to the reference potential node VSS. By causing the test terminal PD to be in the open state, the potential of the test terminal PD becomes 1.2V which is identical with that of the power supply potential node VDD through the pull-up resistor 202. Accordingly, the p-channel FET of the test control circuits 151 to 15n becomes invalid and the gates A1 to An of the power switches 141 to 14n become a state where the gate A1 to An are disconnected from the test terminal PD. The voltage of the gates A1 to An of the power switches 141 to 14n is controlled by the power switch control circuit 121. When each voltage of the gates A1 to An is 1.2V, each of the power switches 141 to 14n is turned ON, respectively. In contrast, when each voltage of the gates A1 to An is 0V, each of the power switches 141 to 14n is turned OFF, respectively According to the first to fifth embodiments, a test may be performed in a state where the power switches 141 to 14n are turned ON while suppressing an area overhead by installing the test terminal PD and the test control circuits 151 to 15n.

A single test terminal PD may be installed without installing n test terminals PD to be corresponded to n circuits 111 to 11n. Further, the disconnectable power supply device is not needed. Accordingly, the area overhead in the semiconductor device according to the first to fifth embodiments may be significantly reduced. Further, the requirement of power consumption reduction along with a high communication rate becomes increasingly serious in the semiconductor device equipped in a mobile terminal. A need for minutely disconnecting the circuits 111 to 11n from the power source arises and thus, the number of circuits 111 to 11n controlled by the power switches 141 to 14n is increasing. A 4G LTE baseband chip which is a standard for high-speed wireless communication has progressed to a situation where the number of circuits 111 to 11n controlled by the power switches 141 to 14n exceeds 30 (thirty). In such a semiconductor device, it is estimated that a chip size of the semiconductor device may be reduced by about 15% according to the first to fifth embodiments. It is expected that the number of circuits 111 to 11n controlled by the power switches 141 to 14n will be increased and an effect caused by applying the first to fifth embodiments further increases.

Further, the size of the transistor (gate width) of the test control circuits 151 to 15n may be desirably smaller than that of the power switches 141 to 14n by about $1/100$ (one-hundredth) to $1/1000$ (one-thousandth).

Further, the size of the transistor (gate width) of the test control circuits 151 to 15n may be desirably smaller than that of the ESD protection element 201 by about $1/1000$.

Further, the embodiments described above only indicate a concrete example in implementing the present disclosure and are not intended to limit a technical scope of the present disclosure by the embodiments. That is, the present disclosure may be implemented in various types without departing from technical ideas and principal features thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first circuit;
   a first power switch provided either between a power supply potential terminal and a power supply potential node of the first circuit or between a reference potential terminal and a reference potential node of the first circuit;
   a power switch control circuit configured to control a voltage of a control terminal of the first power switch;
   a test terminal configured to receive a test signal; and
   a first test control circuit, coupled to the power switch control circuit, the test terminal and the control terminal of the first power switch, configured to control connection of the test terminal and the control terminal of the first power switch,
   wherein the first power switch includes a first p-channel FET (field effect transistor) installed between the power supply potential terminal and the power supply potential node of the first circuit, and the first test control circuit includes a second p-channel FET having a gate and a drain connected to the test terminal and a source connected to the gate of the first p-channel FET.

2. The semiconductor device according to claim 1, wherein in a test mode, a voltage to turn ON the first power switch is applied to the test terminal, the first test control circuit connects the test terminal and the control terminal of the first power switch, and the first power switch is turned ON and, in a normal operation mode, the first test control circuit disconnects the test terminal and the control terminal of the first power switch from each other.

3. The semiconductor device according to claim 1, further comprising;
  a second circuit;
  a second power switch provided either between a power supply potential terminal and a power supply potential node of the second circuit or between a reference potential terminal and a reference potential node of the second circuit; and
  a second test control circuit configured to control connection of the test terminal and a control terminal of the second power switch, and the power switch control circuit is configured to control a voltage of the control terminal of the second power switch.

4. The semiconductor device according to claim 1, further comprising a resistor connected between the test terminal and the power supply potential node.

5. The semiconductor device according to claim 1, further comprising an electrostatic discharge protection element connected between the test terminal and the power supply potential node.

6. The semiconductor device according to claim 1, wherein the second p-channel FET couples the test terminal and the control terminal of the first p-channel FET based on the test signal.

7. A semiconductor device comprising: a first circuit;
  a first power switch provided either between a power supply potential terminal and a power supply potential node of the first circuit or between a reference potential terminal and a reference potential node of the first circuit;
  a power switch control circuit configured to control a voltage of a control terminal of the first power switch;
  a test terminal configured to receive a test signal; and
  a first test control circuit, coupled to the power switch control circuit, the test terminal and the control terminal of the first power switch, configured to control connection of the test terminal and the control terminal of the first power switch,
  wherein the first power switch includes the first p-channel FET (field effect transistor) provided between the power supply potential terminal and the power supply potential node of the first circuit, and the first test control circuit includes a first n-channel having a gate connected to the reference potential node, a source connected to the test terminal, and a drain connected to the gate of the first p-channel FET.

8. The semiconductor device according to claim 7, wherein in a test mode, a voltage to turn ON the first power switch is applied to the test terminal, the first test control circuit connects the test terminal and the control terminal of the first power switch, and the first power switch is turned ON and, in a normal operation mode, the first test control circuit disconnects the test terminal and the control terminal of the first power switch from each other.

9. The semiconductor device according to claim 7, further comprising a resistor connected between the test terminal and the reference potential node.

10. The semiconductor device according to claim 7, wherein the first n-channel FET couples the test terminal and the control terminal of the first p-channel FET based on a reference potential.

11. A semiconductor device comprising:
  a first circuit;
  a first power switch provided either between a power supply potential terminal and a power supply potential node of the first circuit or between a reference potential terminal and a reference potential node of the first circuit;
  a power switch control circuit configured to control a voltage of a control terminal of the first power switch;
  a test terminal configured to receive a test signal; and
  a first test control circuit, coupled to the power switch control circuit, the test terminal and the control terminal of the first power switch, configured to control connection of the test terminal and the control terminal of the first power switch,
  wherein the first power switch includes a first n-channel FET (field effect transistor) installed between the reference potential terminal and the reference potential node of the first circuit, and the first test control circuit includes a second n-channel FET having a gate and a drain connected to the test terminal and a source connected to the gate of the first re-channel FET.

12. The semiconductor device according to claim 11, further comprising an electrostatic discharge protection element connected between the test terminal and the reference potential node.

13. The semiconductor device according to claim 11, wherein in a test mode, a voltage to turn ON the first power switch is applied to the test terminal, the first test control circuit connects the test terminal and the control terminal of the first power switch, and the first power switch is turned ON and, in a normal operation mode, the first test control circuit disconnects the test terminal and the control terminal of the first power switch from each other.

14. The semiconductor device according to claim 11, wherein the second n-channel FET couples the test terminal and the control terminal of the first n-channel FET based on the test signal.

15. The semiconductor device according to claim 11, further comprising a resistor connected between the test terminal and the reference potential node.

16. A semiconductor device comprising:
  a first circuit;
  a first power switch provided either between a power supply potential terminal and a power supply potential node of the first circuit or between a reference potential terminal and a reference potential node of the first circuit;
  a power switch control circuit configured to control a voltage of a control terminal of the first power switch;
  a test terminal configured to receive a test signal; and
  a first test control circuit, coupled to the power switch control circuit, the test terminal and the control terminal of the first power switch, configured to control connection of the test terminal and the control terminal of the first power switch,
  wherein the first power switch includes a first n-channel FET (field effect transistor) installed between the reference potential terminal and the reference potential node of the first circuit, and the first test control circuit includes a first p-channel FET having a gate connected to the power supply potential node, a source connected to the test terminal and a drain is connected to the gate of the first n-channel FET.

17. The semiconductor device according to claim 16, wherein in a test mode, a voltage to turn ON the first power switch is applied to the test terminal, the first test control circuit connects the test terminal and the control terminal of the first power switch, and the first power switch is turned ON and, in a normal operation mode, the first test control circuit disconnects the test terminal and the control terminal of the first power switch from each other.

18. The semiconductor device according to claim 16, wherein the first p-channel FET couples the test terminal and the control terminal of the first n-channel FET based on a power supply potential.

19. The semiconductor device according to claim 16, further comprising a resistor connected between the test terminal and the power supply potential node.

* * * * *